United States Patent
Nogami et al.

(10) Patent No.: US 6,736,699 B2
(45) Date of Patent: May 18, 2004

(54) ELECTROLYTIC POLISHING APPARATUS, ELECTROLYTIC POLISHING METHOD AND WAFER SUBJECT TO POLISHING

(75) Inventors: Takeshi Nogami, Kanagawa (JP); Naoki Komai, Kanagawa (JP); Hideyuki Kito, Kanagawa (JP); Mitsuru Taguchi, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/922,135

(22) Filed: Aug. 3, 2001

(65) Prior Publication Data

US 2002/0090884 A1 Jul. 11, 2002

(30) Foreign Application Priority Data

Aug. 4, 2000 (JP) .................................... P2000-236471

(51) Int. Cl.⁷ .............................................. B24B 49/00
(52) U.S. Cl. ............................ 451/5; 451/8; 451/10; 451/908; 204/212; 204/224 M; 204/297 M
(58) Field of Search ..................... 451/5, 8, 10, 908; 204/212, 224 M, 297 M

(56) References Cited

U.S. PATENT DOCUMENTS

| 5,217,586 | A | * | 6/1993 | Datta et al. | ............... 204/129.6 |
| 6,051,116 | A | * | 4/2000 | Ichinose et al. | ............ 204/212 |
| 6,110,347 | A | * | 8/2000 | Arao et al. | .................. 205/333 |
| 6,204,519 | B1 | * | 3/2001 | Yamazaki et al. | ............ 257/72 |
| 6,299,741 | B1 | * | 10/2001 | Sun et al. | .................... 204/224 |

* cited by examiner

*Primary Examiner*—Joseph J. Hail, III
*Assistant Examiner*—Shantese McDonald
(74) *Attorney, Agent, or Firm*—Robert J. Depke; Holland & Knight LLP

(57) ABSTRACT

An electrolytic polishing apparatus for electrolytic-polishing a conductive film subject to formed on a substrate including a resistance measuring unit for measuring the resistance of the film. The electrolytic polishing apparatus may also include a termination point detecting portion for detecting a termination point of polishing by reading a variation of the resistance value measured by the resistance measuring unit, or a polishing control portion for terminating electrolytic polishing on the basis of the termination point of polishing detected by the termination point detecting portion.

7 Claims, 3 Drawing Sheets

(1)  (2)

ELECTROLYTIC POLISHING APPARATUS, ELECTROLYTIC POLISHING METHOD AND WAFER SUBJECT TO POLISHING

RELATED APPLICATION DATA

The present application claims priority to Japanese Application No. P2000-236471 filed Aug. 4, 2000, which application is incorporated herein by reference to the extent permitted by law.

BACKGROUND OF THE INVENTION

1. Field of the Invention

This invention relates to an electrolytic polishing apparatus, an electrolytic polishing method and a wafer subject to polishing, and more specifically, to an electrolytic polishing apparatus, an electrolytic polishing method and a wafer subject to polishing, which permit detection of a termination point in electrolytic polishing.

2. Prior Art

Copper wiring presents lower electric resistance, lower capacity and higher reliability than aluminum wiring and is thus increasing in importance for micro elements dominantly affected by circuit delay due to parasitic resistance and parasitic capacity occurring in the wiring. A damascene method is widely applied as the most popular method of forming copper wiring. In particular, a dual damascene method meets with general acceptance from the viewpoint of manufacturing cost. There is expectation that a process of manufacturing copper wiring by the use of the dual damascene method will be less costly than a conventional aluminum wiring process.

However, since chemical mechanical polishing (which will be hereinafter referred to as CMP) of copper is considered to be a complicated process requiring expensive slurry and pad, a problem in an increase in manufacturing cost is encountered with the CMP. In addition, since the CMP is based on mechanical polishing, not only copper requiring polishing but also an insulating film around the copper is polished to bring about erosion, resulting in a problem in difficulty to achieve flatness of a wiring layer. The CMP further finds difficulty in detecting a termination point and therefore presents problems like over-polishing and under-polishing. As a result, there are problems in that the CMP causes excessive dishing or inter-wiring short circuit.

An attempt to form a dual damascene structure by polishing copper by means of electrolytic polishing is now being made for the purpose of solving the problems mentioned above.

On the other hand, in electrolytic polishing, a quantity of polishing is decided on the basis of a polishing time. For that reason, an operator finds difficulty in ascertaining a point of time desired to terminate polishing, that is, a termination point of polishing, resulting in problems in that over-polishing or under-polishing occurs depending on variations in thickness of a film subject to polishing, changes in electrolytic polishing conditions or the like.

SUMMARY OF THE INVENTION

An electrolytic polishing apparatus according to a preferred embodiment of the present invention performs electrolytic polishing of a conductive film subject to polishing formed on a substrate and includes a resistance measuring unit for measuring resistance of the film subject to polishing. The electrolytic polishing apparatus also includes a termination point detecting portion for detecting a termination point of polishing by reading a variation of a resistance value measured by the resistance-measuring unit. The electrolytic polishing apparatus further includes a polishing control portion for terminating electrolytic polishing on the basis of the termination point of polishing detected by the termination point detecting portion.

The electrolytic polishing apparatus includes a resistance measuring unit for measuring the resistance of the film subject to polishing, permitting the measurement on the resistance value of the film subject to polishing varying with the progress of electrolytic polishing. That is, with the progress of electrolytic polishing, the thickness of the film subject to polishing is made smaller, and accordingly, the resistance value measured by the resistance measuring unit increases. When the film subject to polishing is completely removed by polishing, the resistance measuring unit proceeds a measurement of a resistance value of the substrate on which the film subject to polishing is formed, for instance, and as a result, the resistance value reaches a constant reaches a constant value.

The electrolytic polishing apparatus detects the termination point of polishing by reading the variation of the resistance value of the film as described the above with the termination point detecting portion. For instance, a point of time when the resistance value reaches a constant value is detected as the termination point of polishing.

Then, the electrolytic polishing apparatus terminates electrolytic polishing immediately after the termination point of polishing is detected. A process between detection of the termination point of polishing and termination of electrolytic polishing may be automatically performed by using the polishing control portion to terminate electrolytic polishing on the basis of detection of the termination point of polishing.

An electrolytic polishing method according another preferred embodiment of the present invention performs electrolytic polishing of a conductive film subject to polishing formed on a substrate and includes the step of detecting a termination point of electrolytic polishing to terminate electrolytic polishing by detecting a variation of electric resistance of the film subject to polishing in the process of electrolytic polishing.

The electrolytic polishing method detects the variation of resistance of the film subject to polishing in the process of electrolytic polishing. That is, with the progress of electrolytic polishing, the thickness of the film subject to polishing is made smaller, and accordingly, the resistance of the film subject increases. When the film is completely electrolytic-polished, the electrolytic polishing method proceeds to measure of a resistance value of the substrate on which the film subject to polishing is formed, for instance, and as a result, the resistance value reaches a constant value. For instance, the time when the measured resistance value reaches a constant value is set as the termination point of polishing. The electrolytic polishing method permits accurate detection of the termination point of electrolytic polishing to terminate electrolytic polishing by detecting the variation of resistance of the film subject to polishing as described the above.

A wafer subject to polishing according to another preferred embodiment of the present invention includes a substrate, a first conductive layer formed on the surface of the substrate, a terminal connection area connected with terminals of a resistance measuring unit and formed on the surface-side periphery of the first conductive layer and a second conductive layer subjected to electrolytic-polishing selectively to the first conductive layer and formed on the surface of the first conductive layer except for the terminal connection area.

According to the wafer subject to polishing, since the terminal connection area is formed on a surface-side periphery of a first conductive layer, a resistance varying according to polishing of a second conductive layer can be measured by, for instance, connecting the terminals of the resistance measurement unit to the portions of the terminal connection area facing each other within a plane of the wafer subject to polishing. Then, when the second conductive layer is removed by means of electrolytic polishing, the thickness of the conductive layer portion is reduced, and accordingly, the measured resistance value increases. When the second conductive layer is completely removed from the first conductive layer by means of electrolytic polishing, the resistance measuring unit proceeds to measure only the resistance of the first conductive layer, and as a result, the resistance value reaches an approximately constant value, regardless of the continuation of electrolytic polishing. For instance, a period of time when the resistance value reaches a constant value is set as the termination point of electrolytic polishing of the second conductive layer, resulting in detection of the termination point of electrolytic polishing.

BRIEF DESCRIPTION OF THE DRAWINGS

The foregoing and other objects and features of the invention will become apparent from the following description of the embodiments of the invention with reference to the accompanying drawings, in which.

DESCRIPTION OF THE PREFERRED EMBODIMENTS

A description will now be given of an embodiment of an electrolytic polishing apparatus according to the present invention with reference to FIG. 1.

Figure 1:
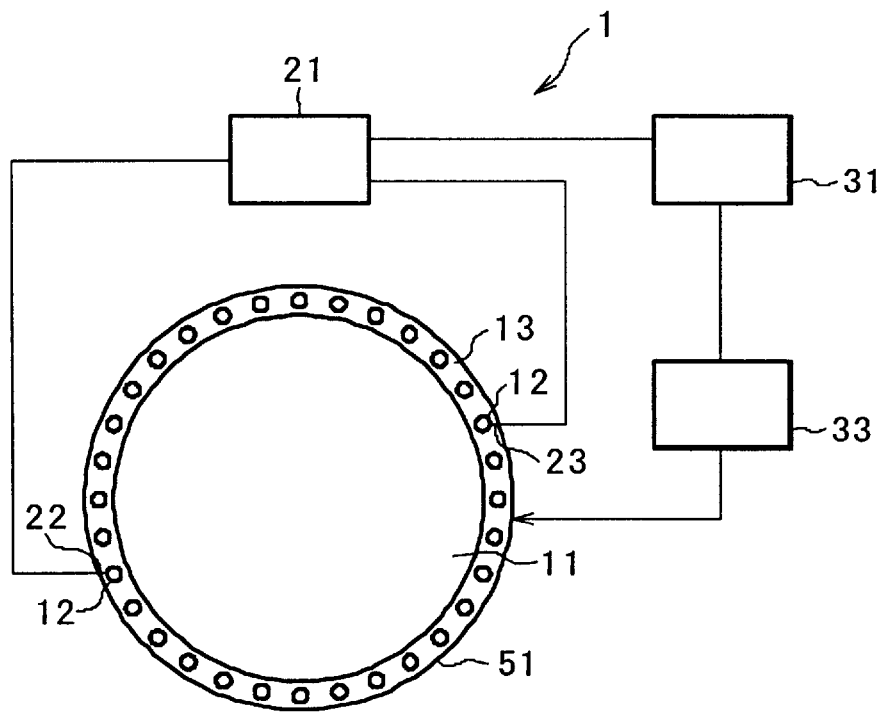
FIG. 1 is a schematic view showing an embodiment of an electrolytic polishing apparatus, according to a preferred embodiment of the present invention.

As shown in FIG. 1, an electrolytic polishing apparatus 1 for electrolytic-polishing a conductive film (not shown) formed on a substrate has a cup 11 for holding an electrolytic polishing solution. In the electrolytic polishing apparatus 1, electrolytic polishing is carried out on a condition on which a wafer 51 having a film subject to polishing (not shown) made of a conductive material is used as anode. Thus, the electrolytic polishing apparatus 1 has a plurality of electrodes 12 connected, for instance, to a surface-side periphery of the wafer 51 as for supplying current to the wafer 51.

The wafer 51 has the film subject to polishing on a conductive film (not shown) formed on the substrate, for instance, and the conductive film is exposed to the outside through the surface-side peripheral portion of the wafer 51. Each electrode 12 is connected to the conductive film exposed to the outside. The electrodes 12 are provided at a predetermined interval, for instance, on an annular insulator 13 of a size as large as the outer periphery of the wafer 51. Rubber is used for the insulator 13, for instance.

The electrolytic polishing apparatus 1 also has a resistance measuring/measurement unit 21 for measuring the resistance of the conductive film formed on the wafer 51. Terminals 22, 23 of the resistance measuring unit 21 are connected to portions of the electrodes 12. The positions of the electrodes connected to the terminals of the resistance measuring unit 21 are opposite to each other through the cup 11. In addition, the terminals 22, 23 of the resistance measuring unit 21 can also be connected to the conductive film communicating with the film subject to polishing of the wafer 51 at positions opposite to each other through the cup 11, instead of the electrodes 12. A plurality of pairs of terminals are also applicable for connection of the resistance measuring unit 21 to the electrodes 12 without being limited to a pair of terminals like the terminals 22, 23 of the resistance measuring unit 21. Non-uniformity in a plane of the wafer 51 is measured by connecting the plurality of pairs of terminals, permitting highly accurate detection of a termination point of electrolytic polishing.

Figure 2:
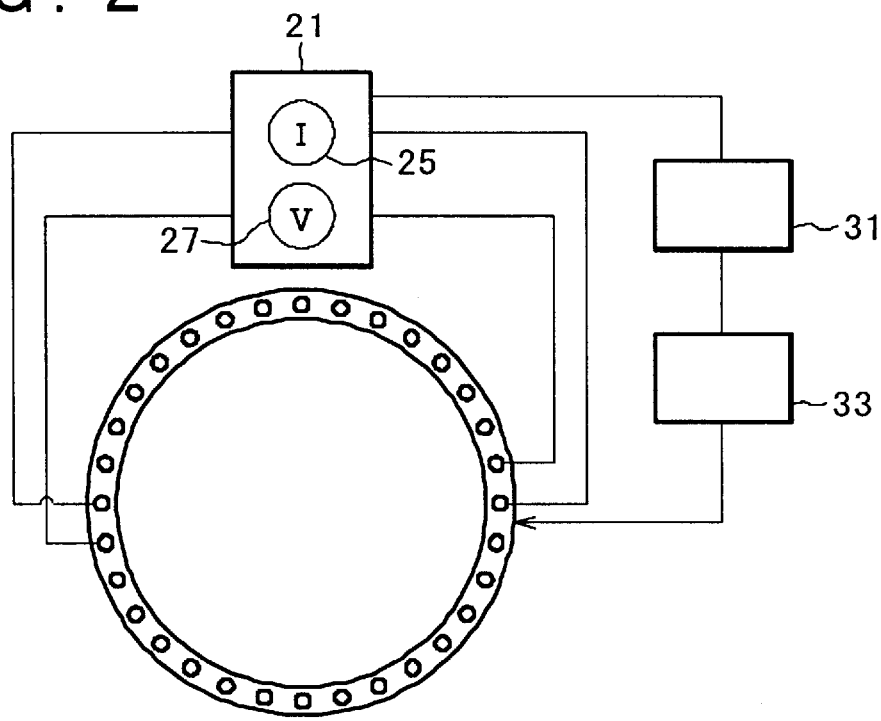
FIG. 2 is a schematic view showing another constitution of a resistance measuring unit, according to a preferred embodiment of the present invention.

A tester may be used for the resistance measuring unit 21 to measure the resistance. As shown in FIG. 2, for instance, the resistance measuring unit 21 may be composed of an ampere meter 25 for measuring current and a voltmeter 27 for measuring voltage so as to calculating the resistance on the basis of the measured current and voltage.

As shown in FIGS. 1 and 2, the resistance measuring unit 21 has further a termination point detecting portion 31 for detecting a termination point of polishing by reading a variation of the measured resistance value. The resistance measuring unit 21 further has a polishing control portion 33 for terminating electrolytic polishing on the basis of the termination point of polishing detected by the termination point detecting portion 31.

The electrolytic polishing apparatus 1 has the resistance measuring unit 21 for measuring the resistance of the film subject to polishing, permitting the measurement of the resistance value of the film subject to polishing varying according to progress of electrolytic polishing. That is, with the progress of electrolytic polishing, the thickness of the film subject to polishing is reduced, and accordingly, the resistance value measured by the resistance measuring unit 21 increases. When the film subject to polishing is completely removed by polishing, the resistance measuring unit 21 proceeds to measure a resistance value of the conductive film on which the film subject to polishing is formed and, as a result, the resistance value reaches a constant value.

The electrolytic polishing apparatus 1 detects the termination point of polishing by reading the variation of the resistance value of the film subject to polishing with the termination point detecting portion 31. For instance, a point when the resistance value reaches a constant value is determined as the termination point of polishing.

The electrolytic polishing apparatus 1 terminates electrolytic polishing immediately after the termination point of polishing is detected. A process between detection of the termination point of polishing and termination of electrolytic polishing may be performed automatically by using the polishing control portion 33 to terminate electrolytic polishing on the basis of detection of the termination point of polishing.

A description will now be given of an embodiment of an electrolytic polishing method according to the present invention with reference to FIGS. 3 and 4.

Figure 3:
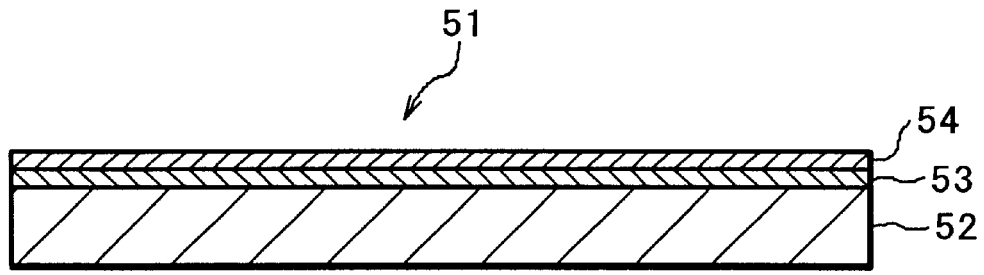
FIG. 3 is a sectional view showing an schematic structure of a wafer subject to electrolytic polishing, according to a preferred embodiment of the present invention.

The wafer 51 has a first conductive film 53 formed on a substrate 52 and a second conductive film 54 formed as a film subject to polishing on the first conductive film 53, as shown in FIG. 3. A description will now be given of a method of electrolytic-polishing the film subject to polishing. The second conductive film 54 brought into contact with an electrolytic polishing solution (not shown) is subjected to electrolytic polishing under a lapse of time, so that the thickness of the second conductive film 54 is made smaller. The electrolytic polishing method is by detecting the termination point of electrolytic polishing to terminate electrolytic polishing by detecting a variation of the resistance of the second conductive film (the film subject to polishing) in the process of electrolytic polishing.

A description will now be given of electrolytic polishing in a damascene process for forming copper wiring. A barrier metal layer is formed as the first conductive film 53 on the substrate 52, and a copper film is formed as the second conductive film 54 on the surface of the barrier metal layer. With the progress of copper electrolytic polishing, the thickness of the copper film on a flat surface is reduced. With a reduction in film thickness, electric conduction becomes dependent only on the barrier metal layer left on a substratum of the copper film and an extremely thin copper film. As a result, a resistance value measured by the resistance measuring unit becomes abruptly increased with the progress of electrolytic polishing as shown in FIG. 4. The rise of the resistance value means that there is little left of a copper film on a flat portion. After going through the rise of the resistance value, the measured resistance value reaches a constant value. The resistance value measured in this place is considered to be a resistance value of the barrier metal, which is formed on the substratum of the copper film. Since the barrier metal layer is not subjected to electrolytic polishing, the resistance of wiring reaches a constant value.

Incidentally, the measurement of the resistance value can be also done by monitoring plating current and voltage applied from an electrode for electrolytic polishing to a facing electrode through the copper film/barrier metal layer. A plurality of pairs of electrodes are also applicable as the electrodes for measurement of the resistance value without being limited to a pair of electrodes. For instance, the plurality of pairs of electrodes may be installed for the measurement of non-uniformity in the plane of the wafer, permitting more highly accurate detection of the termination point of electrolytic polishing.

Figure 5:
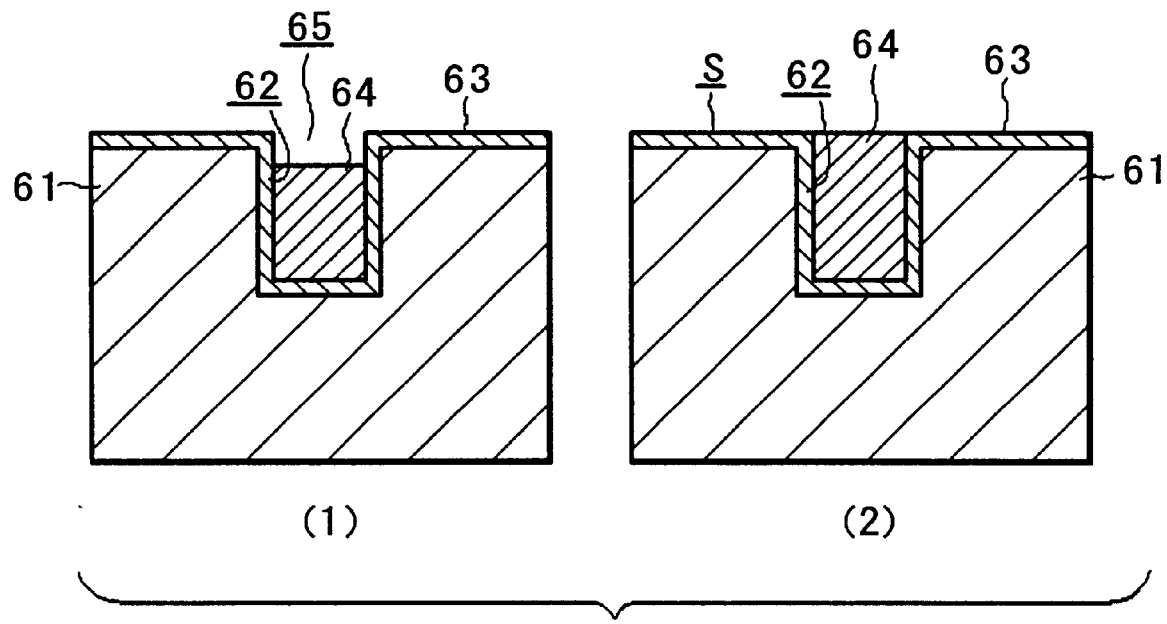
FIG. 5 is a sectional view showing a schematic structure for connection of a termination point of electrolytic polishing, according to a preferred embodiment of the present invention.

Copper electrolytic polishing may be set to bring to stop according to circumstances such as a case of over-polishing a copper film 64 intentionally to form a recess portion 65 in a groove 62 formed in an insulating film 61 through a barrier metal layer 63 as shown in FIG. 5 (1), and a case of just-polishing the copper film 64 to bury the copper film 64 in the groove 62 formed in the insulating film 61 through the barrier metal layer 63 so as to be flush with a flat surface S as shown in FIG. 5 (2).

Figure 4:
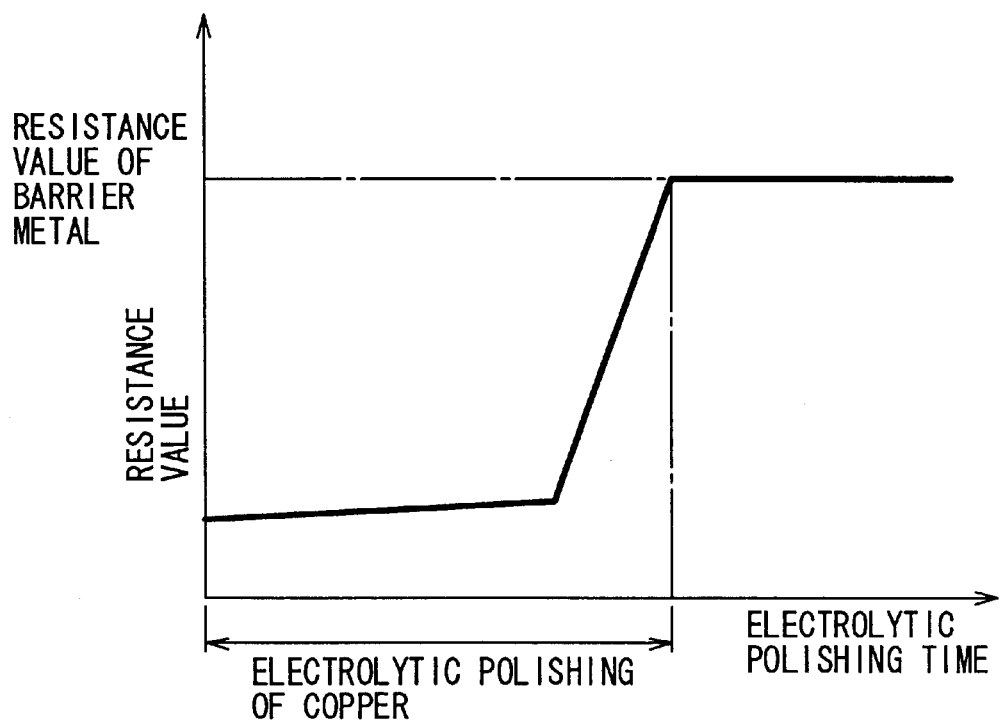
FIG. 4 is a graphic representation showing a relation between resistance value and an electrolytic polishing time, according to a preferred embodiment of the present invention.

Control of a stop point at which electrolytic polishing is stopped can be performed accurately on the basis of the measurement on the variation of the resistance as shown in FIG. 4. As a result, a difficulty in detection of the termination point as the problems encountered with the conventional electrolytic polishing or CMP may be solved, permitting the termination of polishing at a desired polishing condition. An electrolytic polishing system may detect automatically the termination point of polishing to stop polishing by setting feedback for stopping electrolytic polishing when the resistance value reaches an approximately constant value. Incidentally, an operator may also terminate electrolytic polishing after making judgment on the termination point of polishing by reading the variation of the measured resistance value.

An electrolytic polishing method is performed by detecting the variation of the resistance of the film subject to polishing in the process of electrolytic polishing. That is, with the progress of electrolytic polishing, the thickness of the film subject to polishing is made smaller, and accordingly, the resistance of the film subject to polishing increases. When the film subject to polishing is thoroughly polished, the electrolytic polishing method proceeds to measure the resistance value of the substrate on which the film subject to polishing is formed, for instance, and the resistance value reaches a constant value. For instance, a point of time when the measured resistance value reaches a constant or approximately constant value is set as the termination point of polishing. The electrolytic polishing method permits accurate detection of the termination point of electrolytic polishing to terminate electrolytic polishing by detecting the variation of the resistance of the film subject to polishing as described the above.

A description will now be given of an embodiment of a wafer subject to polishing according to the present invention with reference to a sectional view of FIG. 6.

Figure 6:
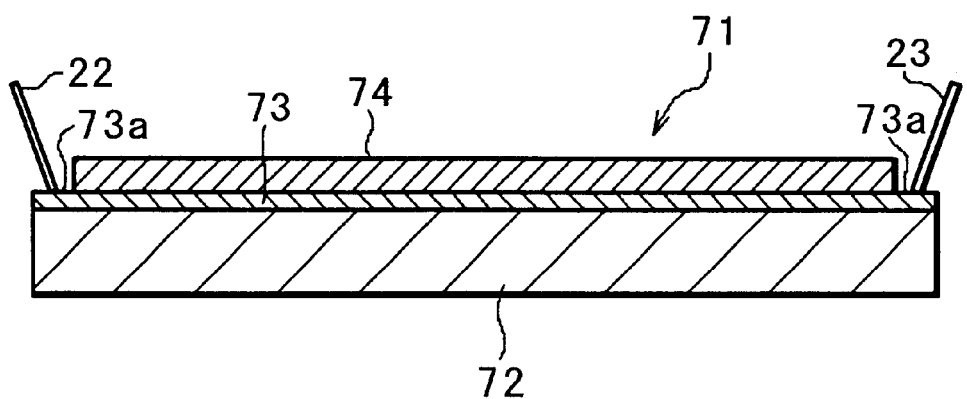
FIG. 6 is a sectional view showing a schematic structure of an embodiment of a wafer subject to polishing, according to a preferred embodiment of the present invention.

As shown in FIG. 6, a wafer 71 subject to polishing (equivalent to the wafer 51 mentioned above) has a substrate 72, a first conductive layer 73 formed on a surface of the substrate 72, a terminal connection area 73a connected with the terminals 22, 23 of the resistance measuring unit and formed on the surface-side periphery of the first conductive layer 73 and a second conductive layer 74 subjected to electrolytic-polishing selectively to the first conductive layer 73 and formed on the surface of the first conductive layer 73 except for the terminal connection area 73a.

Since the wafer 71 subject to polishing has the terminal connection area 73a on the surface-side periphery of the first conductive layer 73, the resistance value of the film subject to polishing (the first and second conductive layers 73, 74, practically) varying according as the second conductive layer 74 is electrolytic-polished may be measured by connecting the terminals 22, 23 of the resistance measuring unit to the terminal connection area portions 73a facing each other in the plane of the wafer subject to polishing 71, for instance. When the second conductive layer 74 is removed by means of electrolytic polishing, the thickness of the conductive layer portion is reduced, and therefore, the measured resistance value increases. When the second conductive layer 74 is completely removed from the first conductive layer 73 by means of electrolytic polishing, the resistance measuring unit (not shown) proceeds to measure only the resistance of the first conductive layer 73, and the resistance value reaches an approximately constant value regardless of the continuation of electrolytic polishing. For instance, this point of time when the resistance value reaches a constant value is set as a termination point of electrolytic polishing of the second conductive layer 74, resulting in detection of the termination point of electrolytic polishing.

As has been described in the foregoing, the electrolytic polishing apparatus according to the present invention includes the resistance measuring unit for measuring the resistance of the film subject to polishing, permitting the measurement on the resistance value of the film subject to polishing varying with the progress of electrolytic polishing. Thus, the electrolytic polishing apparatus may detect the termination point of polishing by reading the variation of the resistance value of the film subject to polishing varying with the progress of electrolytic polishing. Further, the process between detection of the termination point of polishing and termination of electrolytic polishing can be automatically performed by using the polishing control portion to terminate electrolytic polishing on the basis of detection of the termination point of polishing. Thus, the electrolytic polishing apparatus of the present invention permits highly accurate electrolytic polishing.

The electrolytic polishing method of the present invention is performed by detecting the variation of resistance of the film subject to polishing in the process of electrolytic polishing, permitting accurate detection of the termination point of electrolytic polishing to terminate electrolytic polishing by reading the variation of the resistance value. Thus, the electrolytic polishing method of the present invention permits highly accurate electrolytic polishing.

Since the wafer subject to polishing of the present invention has the terminal connection area on the surface-side periphery of the first conductive layer, the resistance value of the film subject to polishing varying according to the electrolytic polishing of the second conductive layer can be measured by connecting the terminals of the resistance measuring unit to the terminal connection area portions facing each other in the plane of the wafer subject to polishing, for instance. The wafer subject to polishing on which measurement of the variation of the resistance value thereof in the process of electrolytic polishing can be used for detecting the termination point of polishing accurately to terminate electrolytic polishing. Thus, the wafer subject to polishing of the present invention permits highly accurate electrolytic polishing.

Finally, the configurations and structures of respective units and portions described specifically with respect to the preferred embodiments of the present invention are only examples of realization of the present invention, so the embodiments thereof should not be construed as to limiting the technical scope of the present invention.

Accordingly, the present invention is not limited to the preferred embodiments described above, thus any variation as well as any combination and/or sub combination of the embodiments is permitted, without departing from the scope of the present invention.

For example, although the polishing method described above is done based on an electrolytic polishing apparatus and method, it is not limited to such type of polishing. Also, any kind or method of measurement can be applicable to the present invention, provided that measurement of electric resistance of the barrier layer combined with the layer to be polished is measured so as to establish the terminating point of polishing.

What is claimed is:

1. An electrolytic polishing apparatus for electrolytic-polishing a conductive film formed on a substrate, comprising:

a resistance measuring unit for measuring electric resistance of said conductive film and a etching stopper film formed on said substrate, and further comprising a termination point detecting unit for detecting a termination point of polishing by reading a variation resistance value of said conductive film and said etching stopper film measured by said resistance measuring unit.

2. The electrolytic polishing apparatus according to claim 1, further comprising a polishing control means for terminating electrolytic polishing said conductive film detected by said termination point detecting unit.

3. An electrolytic polishing method for electric-polishing a conductive film formed on a substrate, comprising steps of:

terminating said electrolytic polishing upon detecting a variation of resistance value of said conductive film and a etching stopper film in the process of electrolytic polishing and determining a termination point of said electrolytic polishing.

4. A wafer comprising;

a substrate:

a first conductive layer formed on a surface of said substrate;

a terminal connection area connected with terminals of a resistance measuring unit, said terminal connection area formed on surface-side periphery of said first conductive layer; and a second conductive layer subjected to selective electrolytic polishing against said first conductive layer, said second conductive layer formed on a surface of said first conductive layer except on said terminal connection area.

5. An electrolytic polishing apparatus for electrolytic-polishing a conductive film formed on a substrate, comprising:

a resistance measuring unit for measuring electric resistance of said conductive film and a etching stopper film formed on said substrate, and further comprising a means for detecting a termination point of polishing by detecting a variation of the electric resistance of said conductive film and said etching stopper film measured by said means for measuring electric resistance.

6. The polishing apparatus according to claim 5, further comprising a means for terminating electrolytic polishing of said conductive film based on information from said means for detecting the termination point of polishing.

7. A wafer comprising:

a substrate;

a first conductive layer formed on a surface of said substrate;

a means for connecting said first conductive layer with a means for measuring electric resistance; and a second conductive layer formed on a surface of said first conductive layer, wherein said second conductive layer is subject to polishing against said first conductive layer.

* * * * *